United States Patent [19]

Hoffmann et al.

[11] 3,861,921

[45] Jan. 21, 1975

[54] SUBBING LAYERS COMPRISING POLYAMIDE AND PHENOLIC RESIN FOR METAL BASES OF PHOTOPOLYMERIZABLE ELEMENTS

[76] Inventors: Horst Hoffmann, 4 Neuwiesenstrasse; Christian Srna, 6 Ungsteiner Strasse, both of 6700 Ludwigshafen; Guenther Sabelus, 25 Neustadter Strasse, 6715 Lambsheim; Georg Falkenstein, 22 Im Kaestenbush, 6730 Neustadt; Udo Strauss, 3 Haydnstrasse, 6900 Heidelberg, all of Germany

[22] Filed: Jan. 12, 1973

[21] Appl. No.: 323,135

[30] Foreign Application Priority Data

Jan. 19, 1972 Germany .................. P 22 02 357

[52] U.S. Cl. ................ 96/86 P, 96/35.1, 96/115 P, 117/75, 156/330, 156/331, 156/335

[51] Int. Cl. ...... G03c 1/94, G03c 5/00, G03c 1/68, B41n 1/18

[58] Field of Search ........... 96/86 P, 115 P; 117/75; 156/331, 330, 335

[56] References Cited

UNITED STATES PATENTS

| | | | |
|---|---|---|---|
| 2,760,863 | 8/1956 | Plambeck | 96/115 P |
| 3,081,168 | 3/1963 | Leekley et al. | 96/86 P |
| 3,259,499 | 7/1966 | Thommes | 96/115 R |
| 3,733,200 | 5/1973 | Takaishi et al. | 96/86 P |

*Primary Examiner*—Norman G. Torchin
*Assistant Examiner*—Richard L. Schilling
*Attorney, Agent, or Firm*—Johnston, Keil, Thompson & Shurtleff

[57] ABSTRACT

Laminates for the production of printing plates comprising a metal base (a), an intermediate layer (b) consisting of a mixture of a polyamide (b1) and a curable phenolic resin (b2) with or without a curable aminoplast or epoxy resin, which mixture can be cured by heating, and a layer (c) of a photopolymerizable mixture of a polyamide and monomers for the production of the printing relief.

11 Claims, No Drawings

SUBBING LAYERS COMPRISING POLYAMIDE AND PHENOLIC RESIN FOR METAL BASES OF PHOTOPOLYMERIZABLE ELEMENTS

The present invention relates to laminates which are suitable for the production of printing plates comprising a metal base, an intermediate layer of a crosslinked polymer, a layer of a photocross-linkable mixture of a polyamide and monomers having photopolymerizable ethylenically unsaturated double bonds, and an optional thin light-transmitting protective cover sheet.

It is known to prepare laminates by applying a layer of a mixture of monomers containing photopolymerizable double bonds, solid polymers and photoinitiators to metal bases and to use them, for example, for the production of printing plates. The photopolymerizable layer on the base is exposed through an image-bearing transparency such as a negative or positive, crosslinking of the photopolymerizable layer occurring at the exposed areas. The printing relief can then be produced by washing out the unexposed areas of the layer with a solvent. Polyamides on which the photopolymerizable layer is based are particularly suitable for the production of photopolymer laminates of this type because they are very abrasion resistant, which is of great importance when the relief-bearing plates are used for printing purposes. However, photopolymerizable layers based on polyamides have the disadvantage that they do not adhere at all well to metal bases to which they are usually laminated. Owing to this poor adhesion the photosensitive layer often becomes detached from the metal base during storage of the plates, thus rendering the laminates useless for the subsequent production of printing plates.

Attempts have been made to overcome this disadvantage by using various adhesives. However, conventional adhesives either do not bond the photopolymerizable layer firmly enough to the metal base or are frequently soluble in the solvents or solvent mixtures that are contained in printing inks or used as type washes. This results in delamination, softening, swelling and dissolution of the adhesive layer. Moreover, such adhesives provide bonds which are not very resistant to high temperatures, which is a disadvantage when the relief plates are used for the production of plastics mats by the hot molding process. It is known from Swiss Pat. No. 421,708 to prepare thin, flexible, photopolymerizable elements comprising a photopolymerizable image layer, a barrier layer and a curable adhesive layer on a flexible support, particularly polyethylene terephthalate films, in such a way that a layer of the photopolymerizable composition consisting of monomers and a compatible polymeric binder such as are also used for the production of the photopolymerizable image layer is applied to the polyethylene terephthalate film provided with the layer of curable adhesive and partially crosslinked, and a layer of the photopolymerizable composition used for the image layer is then applied. However, the resulting flexible photopolymerizable elements are not satisfactory in a number of respects, for example the use of the monomers employed in the photopolymerizable layer for the barrier layer is not very economical and the obtainment of the precise degree of polymerization of part of the barrier layer is critical in commercial operation. If polymerization is incomplete, a barrier layer is obtained which can be swollen to a marked extent or partially dissolved. When synthetic polyamides are used as polymeric binders and metal supports are employed, there result laminates exhibiting poor adhesion between the barrier layer and base.

An object of the present invention is to provide laminates which are suitable for the production of printing plates, which can be produced on a commercial scale easily and economically and which exhibit good adhesion between the photopolymerizable layer and the base during prolonged storage both prior to and after exposure.

We have now found that laminates which are suitable for the production of printing plates and consist essentially of a. a metal base which may have been pretreated mechanically and/or chemically and/or with a primer,
b. a thin intermediate layer of a crosslinked polymer,
c. a thin layer which is solid at room temperature and consists essentially of a photopolymerizable intimate mixture of
  c1. 50 to 90% by weight of a synthetic polyamide which is solid at room temperature and soluble in an organic solvent and contains recurring amide groups in the main chain of the molecule,
  c2. 10 to 50% by weight of at least one monomeric compound containing at least two photopolymerizable ethylenically unsaturated double bonds or of a mixture of at least one such compound with not more than about 30% by weight, based on the total amount of monomers, of at least one monomeric compound having only one photopolymerizable ethylenically unsaturated double bond, the monomers not boiling at a temperature below 100°C at atmospheric pressure, and
d. an optional thin light-transmitting protective cover sheet, exhibit the desired improved properties when they contain as intermediate layer (b) a layer which has been cured by heating to a temperature of from 80° to 300°C and is based on an intimate mixture of (b1) 50 to 98% by weight of a synthetic polyamide which is solid at room temperature, contains recurring amide groups in the main chain of the molecule and is substantially compatible with the polyamide of layer (c), and (b2) 2 to 50% by weight of a curable phenolic resin having a molecular weight of less than 10,000 or a mixture of such a phenolic resin with an amount of a curable amino or epoxy resin having a molecular weight of less than 1,000 which is smaller than the amount of phenolic resin.

A further object of the invention is to provide a process for the production of laminates which are suitable for the production of printing plates wherein there is applied to a metal base (a), which may if desired have been pretreated mechanically and/or chemically and/or with a primer, a thin intermediate layer (b) based on an intimate mixture of b1. 50 to 98% by weight of a synthetic polyamide which is solid at room temperature, contains recurring amide groups in the main chain of the molecule and is substantially compatible with the polyamide of layer (c), and
b2. 2 to 50% by weight of a curable phenolic resin having a molecular weight of less than 10,000 or a mixture of such a phenolic resin with an amount of a curable amino or epoxy resin having a molecular weight of less than 1000 which is smaller than the amount of phenolic resin, the applied intermediate layer (b) is cured (crosslinked) at a temperature of from 80° to 300°C, a thin layer (c) which is solid at room temperature and consists essentially of a photopolymerizable intimate mixture of c1. 50 to 90% by weight of a synthetic polyamide which is solid at room temperature and soluble in an organic solvent and contains recurring amide groups in the main chain of the molecule, and c2. 10 to 50% by weight of at least one monomeric compound containing at least two photopolymerizable ethylenically unsaturated double bonds or of a mixture of at least one such compound with less than 30% by weight, based on the total amount of monomers, of at least one monomeric compound having only one photopolymerizable ethylenically unsaturated double bond, the monomers not boiling at a temperature below 100°C at atmospheric pressure, is applied in a conventional manner, and a thin light-transmitting protective cover sheet (d) may then be applied if desired.

The outstanding adhesion between the base and the photosensitive layer exhibited by the laminates prepared according to the invention and which is not measurably impaired even after the laminates have been stored for 100 hours at 50°C prior to exposure is all the more surprising because numerous laminates of a very similar construction do not possess this property. In the case of an element in which the photopolymerizable layer (c) is bonded to the metal base with a commercial polyurethane adhesive containing an excess of isocyanate groups, the bonding strength of the adhesive decreases during storage, this undesirable process being accelerated to a marked extent by tempering at 50°C. The use of nylon 11 alone for the intermediate layer (b) gives just as unsatisfactory results as the use of a polyamide bearing N-methylol groups. An attempt to improve adhesion between the metal base and the photopolymerizable layer (c) by the co-use of carboxyl-containing monomers or other carboxyl-containing compounds, contrary to expectations, did not bring about the desired effect. By contrast, the laminates produced according to the invention show good adhesion between the photopolymerizable layer and the support not only prior to exposure but also after exposure and development of the photosensitive layer (c) despite the fact that, as is well known, shrinkage of the exposed areas of the layer (c) as a result of the photopolymerization reaction and treatment of the layers with developer solution, which may result in swelling, impair adhesion and consequently present particular problems in the production of firmly adhering laminates. A further advantage of the laminates of the invention is that they can be readily reproduced in commercial production.

In accordance with the invention a layer based on an intimate mixture of (b1) 50 to 98%, particularly 80 to 95%, by weight of a synthetic polyamide which is solid at room temperature and substantially compatible with the polyamide of layer (c) and (b2) 2 to 50%, particularly 5 to 20%, by weight of a curable phenolic resin is used as intermediate layer (b).

Suitable polyamides for the intermediate (adhesive) layer (b) are conventional crosslinkable polyamides uch as the polycondensates of dicarboxylic acids and diamines or the polycondensation products of lactams or mixtures of a plurality of the said starting products. Copolyamides which are present in an amorphous glasslike state and are soluble in organic solvents are particularly suitable. Such copolyamides can be prepared for example from adipic acid, 1,6-hexamethylenediamine and caprolactam or adipic acid salts of various diamines and caprolactam or a higher lactam such as capryllactam. A cocondensate prepared from approximately equal parts by weight of hexamethylenediamine adipate, caprolactam and a salt derived from equimolar amounts of adipic acid and 4,4'-diaminodicyclohexylmethane having a K value of from about 60 to 70, which cocondensate is soluble in an alcoholic solvent, has proved to be outstandingly suitable.

Suitable curable phenolic resins having a molecular weight of less than 10,000, particularly of less than 2,000, are condensates of aromatic phenolic compounds, such as phenol, cresols, xylenols, polynuclear phenolic compounds, such as 2,2-bis(4-hydroxyphenyl)-propane, or mixtures thereof with aldehydes, particularly formaldehyde of the resol type. The condensates which are generally produced by reacting the phenolic compounds with formaldehyde in the free form or with compounds eliminating formaldehyde in a molar ratio of phenol to formaldehyde of 1:1 to 1:3, preferably in the presence of basic catalysts, should contain reactive methylol groups which may be esterified with an aliphatic monocarboxylic acid of 2 to 20 carbon atoms or preferably etherified with an aliphatic alcohol of 1 to 8 carbon atoms, e.g. n-butyl alcohol and ethyl glycol. Highly suitable are phenolic resins which are soluble in alcoholic and/or aqueous solvents and have been prepared by condensation of a bisphenol, such as 2,2-bis(4-hydroxyphenyl)-propane and 4,4'-dihydroxydiphenylmethane, alone or in admixture with a mononuclear phenol, such as phenol and cresol, with a molar excess of formaldehyde in the presence of an amine as catalyst, preferably in a water-containing reaction medium and in the presence of an amine which is compatible with water.

Although a mixture of phenolic resin and polyamide has proved to be particularly suitable for adhesive layer (b), for some applications it is advantageous to add a curable amino or epoxy resin havig a molecular weight of less than 1000 to the mixture. Suitable amino resins include melamine-formaldehyde precondensates which contain from 1 to 10 melamine nuclei per molecule and whose $NH_2$ groups per mole have been reacted with more than 1 or 2 moles of formaldehyde; the reactive methylol groups may be partially or wholly etherified with lower aliphatic alcohols such as methanol, ethanol and n-butanol. Urea-formaldehyde condensates of analogous structure are equally suitable. In their case, too, the methylolamide groups are preferably etherified, as a result of which, if alcohols of at least 4 carbon atoms are used for the etherification, the resins which are originally hydrophilic are converted into lipophilic resins. Suitable curable epoxy resins are relatively low molecular weight diepoxides and polyepoxides such as are formed in the epoxidation of olefinically unsaturated compounds or glycidyl esters or ethers such as are formed for example in the reaction of polyhydric alcohols or polyhydric phenols with epichlorohydrin in the presence or absence of alkali. The epoxy resins react with the OH groups which are present and thus increase the density of crosslinking in the mixture used for layer (b). It should be mentioned that the polyamides used generally do not contain any amino groups and consequently cannot act as curing agents for the epoxy resins like the basic polyamides which are commercially available as curing agents for epoxy resins. The amount of aminoplast which may be admixed with the curable phenolic resin is generally smaller than that of the phenolic resin used; it is for example 5 to 50%, preferably 5 to 30%, by weight of the phenolic resin. It is particularly advantageous to select phenolic resins, amino resins and/or epoxy resins which form a substantially compatible mixture with the polyamides.

Mixing of the polyamides with the phenolic resins or a mixture of the phenolic resins with an amino resin and/or epoxy resin for the preparation of the adhesive layer (b) according to the invention is advantageously carried out by dissolving all the components in a suitable solvent. Examples of suitable solvents are lower aliphatic alcohols, alcohol/water mixtures, ketones, cresols or formic acid which may be used alone or in admixture with other conventional solvents such as aromatic hydrocarbons and ethers. The solution of the components is then applied to the metal base in a conventional manner, e.g. by brushing, roller coating, spraying, casting or dipping. The applied coating is then ventilated, the solvent evaporated at elevated temperature at atmospheric pressure or in vacuo, and baked. The polyamides and the resins may however also be finely ground together in the solid state and mixed, the resulting mixture then being melted in a conventional manner onto the metal base to be coated at temperatures of up to 300°C. It is in principle also possible to coat the base by fluidized-bed coating or the electrostatic application of powders. The material is advantageously applied in such an amount that cured coatings having a thickness of from 5 to 200$\mu$, preferably from 10 to 50$\mu$, are obtained.

The coating (b) is cured (crosslinked) by heating it at 80° to 300°C, particularly at 120° to 220°C, generally for 5 to 200 minutes, particularly for 10 to 60 minutes. Normally temperatures at which crosslinking occurs are required to vaporize the solvent or to melt the components for intermediate layer (b), so that coating and curing can be carried out in one operation. In the case of a preferred mixture of an alocohol-soluble copolyamide and a phenolic resin for intermediate layer (b) baking of the layer at a temperature of about 150°C for about 20 minutes has proved to be suitable.

The mixture for adhesive layer (b) may of course have added to it, during its manufacture, pigments, pigmenting aids and other substances having a favorable influence on its processing characteristics. It is generally advisable to add a pigment which absorbs actinic radiation, thus providing halation protection for the photopolymer layer (c). Suitable pigments are those on an organic or inorganic basis, e.g. iron oxide and lead chromate. Dispersing agents and flow improvers may also be added to the mixture to improve dispersability of the pigments and flow of the mixture used for adhesive layer (b) during the coating operation prior to baking.

Particularly suitable metal bases (a) are metal sheets, metal foils and metal cylinders which are preferably made of aluminum or steel. The metal base sheets, foils or cylinders can be subjected to a conventional pretreatment prior to application of the adhesive layer to further improve the bond between the support and layer (b). This pretreatment may be a mechanical one, e.g. mat finishing with rolls and sandblasting, and/or a chemical one, e.g. pickling with phosphoric acid, hydrofluoric acid or chromic acid (bonderizing, "alodining"). In many cases it is advantageous to also prime the metal base. Commercial primers based on polyvinyl butyral, polyepoxides or polyurethanes together with conventional pigments, fillers, flow improvers, etc. may be used for this purpose. These primers often form a corrosion-resistant polymeric sublayer which bonds well with the intermediate layer (b) of the invention. Suitable primers are mixtures of hydroxyl-containing polyesters with polyisocyanates, particularly a mixture of a commercially available polyester derived from 2.5 moles of adipic acid, 0.5 mole of phthalic acid and 4 moles of a triol with a triisocyanate prepared from 1 mole of trimethylolpropane and 3 moles of toluylene diisocyanate. Advantageously 0.7 to 1.5 isocyanate groups of the polyisocyanate are used per hydroxyl group of a hydroxyl-containing polyester. In many cases it is particularly advantageous to avoid an excess of isocyanate groups in the primer. The applied primer is then baked, preferably at a temperature of from about 120° to 150°C for about 30 to 60 minutes.

Particularly suitable polyamides (c1) for the photosensitive layer (c) are linear synthetic polyamides which contain recurring amide groups in the main chain of the molecule and which are soluble in organic, especially alcoholic, solvents usually used as developer solutions. Of these, copolyamides are preferred which are soluble in solvents or solvent mixtures usually used as developers, such as lower aliphatic alcohols, alcohol/water mixtures or mixtures of alcohols with other solvents such as benzene/alcohol/water mixtures, or which are soluble in ketones or esters. Examples of such copolyamides are those which have been prepared in a conventional manner by polycondensation or polymerization, e.g. activated anionic polymerization, of two or more lactams containing from 5 to 13 ring members. Examples of such lactams are pyrrolidone, caprolactam, enantholactam, capryllactam, laurolactam or corresponding C-substituted lactams such as C-methyl-$\epsilon$-caprolactam, $\epsilon$-ethyl-$\epsilon$-caprolactam and $\delta$-ethylenantholactam. Instead of the lactams themselves, the aminocarboxylic acids on which they are based may be polycondensed. Other suitable copolyamides are polycondensation products of salts of the diamine/dicarboxylic acid type, prepared from at least three polyamide-forming starting materials. Preferred suitable dicarboxylic acids and diamines for this purpose are aliphatic dicarboxylic acids having from 4 to 20 carbon atoms, such as adipic acid, suberic acid, sebacic acid, dodecanedicarboxylic acid and corresponding substitution products such as $\alpha,\alpha$-diethyladipic acid, $\alpha$-ethylsuberic acid, heptadecanedicarboxylic acid-(1,8) or heptadecanedicarboxylic acid-(1,9) or mixtures thereof, and dicarboxylic acids containing aliphatic or aromatic ring systems. Particularly suitable diamines are aliphatic or cycloaliphatic diamines having two primary and/or secondary amino groups, particularly those having from 4 to 20 carbon atoms, such as pentamethylene diamine, hexamethylene diamine, heptamethylene diamine, octamethylene diamine or C- and/or N-substituted derivatives of such amines, for example N-methyl-N'-ethylhexamethylene diamine, 1,6-diamino-4-methylhexane, 4,4'-diaminodicyclohexylmethane and 4,4'-diaminodicyclohexylpropane, as well as aromatic diamines such as m-phenylene diamine, m-xylylene diamine and 4,4'-diaminodiphenylmethane. In all of the above starting materials, the bridging groups between the two carboxylic acid groups or amino groups may be optionally interrupted by heteroatoms such as oxygen, nitrogen or sulfur atoms. Particularly suitable copolyamides are those which have been prepared by cocondensation of a mixture of one or more lactams, in particular caprolactam, and at least one salt of a dicarboxylic acid and a diamine, for example ε-caprolactam, hexamethylenediammonium adipate and 4,4'-diaminodicyclohexylmethane adipate. The polyamides listed above may also be used for intermediate layer (b). It is particularly advantageous for the polyamide of intermediate layer (b) and the polyamide in the photosensitive layer (c) to have the same or a very similar structure.

Suitable monomers for use in the photosensitive layer (c) are compounds which contain photopolymerizable olefinically unsaturated double bonds and which are compatible to the extent of at least 20 to 50% by weight with the polyamides used for the layer. The bulk of the monomers used, preferably from 70 to 100% by weight of the total amount of monomers used, should contain more than one photopolymerizable olefinic double bond. Very suitable monomers having at least two polymerizable olefinic double bonds are those which contain, in addition to their double bonds, amide groups such as amides derived from acrylic acid and/or methacrylic acid. Specific examples are alkylene-bis-(meth)acrylamides, such as methylene-bis-acrylamide and methylene-bis-methacrylamide, the bis-acrylamides and/or bis-methacrylamides of aliphatic, cycloaliphatic and aromatic diamines or polyamines of from 2 to 12 carbon atoms, for example of ethylene diamine, propylene diamine, butylene diamine, pentamethylene diamine, hexamethylene diamine, heptamethylene diamine, octamethylene diamine, xylylene diamine, as well as polyamines and other diamines which may, if desired, be branched or interrupted by heteroatoms such as oxygen, nitrogen or sulfur atoms. Highly suitable are diethers of 1 mole of an aliphatic diol or polyol and 2 moles of N-methylol(meth)acrylamide. Photopolymerizable monomers which are also very suitable are those which contain, optionally in addition to amide groups, urethane or urea groups, such as the reaction products of mono(meth)acrylates of aliphatic diols with diisocyanates or the corresponding reaction products of mono(meth)acrylamides of diamines with diisocyanates. Further examples of suitable nitrogen-containing monomers are triacryloyl perhydrotriazine and triallyl cyanurate. Also suitable are the diacrylates, triacrylates and tetraacrylates and the dimethacrylates, trimethacrylates and tetramethacrylates of polyhydric alcohols and phenols, e.g. di- and triethylene glycol di(meth)acrylates. However, the use of bifunctional or polyfunctional polymerizable monomers is not limited to the selection given above. It also includes other monomers having at least two polymerizable double bonds provided that these are compatible to the extent of at least 20 to 50% with the copolyamides included in the mixture, which can be readily determined by simple experiment.

In addition to the monomers having more than one polymerizable olefinic double bond, minor amounts, particularly amounts of not more than 30% by weight of the total amount of monomers, of monomers having only one polymerizable olefinic double bond may be used, examples being acrylamides or methacrylamides and their substitution products, e.g. N-methylol(meth)acrylamide, or their ethers or esters or monoesters of olefinically unsaturated carboxylic acids having from 3 to 5 carbon atoms and aliphatic diols or polyols, e.g. mono(methyl)acrylates of ethylene glycol, diethylene glycol, triethylene glycol, glycerol, 1,1,1-trimethylolpropane and 1,4-butanediol. Their choice is governed by the above stipulations and the purpose for which the photosensitive mixtures are to be used.

Very suitable photocrosslinkable mixtures for layer (c) contain from 10 to 50%, particularly 20 to 40%, by weight of monomers and from 90 to 50%, particularly from 80 to 60%, by weight of soluble polyamides. By "soluble polyamides" we mean polyamides which are sufficiently soluble in the solvents used, during development of the relief printing plates, to wash out the unexposed and consequently non-crosslinked areas of layer (c). Particularly the abovementioned solvents which dissolve the synthetic polyamides are suitable for this purpose.

The photosensitive layer (c) advantageously contains photoinitiators. Particularly suitable photoinitiators are compounds which decompose with the formation of free radicals under the action of light or other radiation and thus initiate polymerization of the monomers. Examples are vicinal ketaldonyl compounds such as diacetyl, benzil, α-ketaldonyl alcohols such as benzoin, acyloin ethers such as benzoin methyl ether and benzoin isopropyl ether, α-substituted aromatic acyloins such as α-methylbenzoin, α-methylolbenzoin and α-methylolbenzoin methyl ether. The photoinitiators are used in the usual amounts, advantageously in amounts from 0.01 to 10%, preferably from 0.01 to 3%, by weight based on the total weight of the photosensitive layer (c).

The photosensitive layer (c) may also contain thermal polymerization inhibitors. Suitable inhibitors are for example hydroquinone, p-methoxyphenol, p-quinone, methylene blue, β-naphthol, phenols and salts of N-nitrosocyclohexylhydroxylamine. These inhibitors are usually used in amounts of from 0.01 to 2.0%, preferably in amounts of from 0.05 to 0.5%, by weight based on the total weight of the photosensitive layer (c).

Small amounts of conventional additives, for example organic-solvent-soluble metal complex dyes, phthalocyanine dyes or indigoid dyes, may also be included in the photosensitive mixture used for layer (c). These additives are used in amounts of from about 0.01 to about 5% by weight based on the total weight of the photosensitive layer (c). The layer frequently contains small amounts of residual solvent such as ethylene glycol.

A particular advantage of the laminates of the invention resides in the fact that they can be manufactured by several laminating or bonding methods. For example, the photosensitive layer (c) in the form of a sheet or film can be pressed with the application of pressure onto the cured intermediate layer (b) applied to the metal base at elevated temperature. Another method is to laminate blank photopolymer film material without a base, with the application of light pressure, to sheets or cylinders provided with intermediate layer (b) according to the invention. In this method a suitable solvent can be employed as laminating aid. A particularly advantageous method consists in casting the photopolymerizable mixture for photosensitive layer (c) in the form of a dilute or concentrated solution direct onto the sheets provided with intermediate layer (b), excellent bonds being achieved. The thickness of the photosensitive layer (c) depends on the intended application of the laminate and is generally from about 100 to 2000 μ, particularly from about 500 to 1500 μ.

The laminates of the invention can be processed into printing plates in a conventional manner, conventional light sources, preferably lamps emitting a high proportion of high-energy radiation, such as carbon arc lamps, mercury vapor lamps, xenon lamps and fluorescent tubes, being used for exposure. Development of the printing plate by washing out the unexposed areas with solvents (developer solutions) may also be carried out in a conventional manner.

It is a particular advantage of the laminates of the invention that the resulting relief plates exhibit good adhesion between the metal support and the photopolymer layer. This property is particularly advantageous in the case of wrap-around plates for sheet-fed rotary letterpress machines and dry offset printing presses. Relief plates prepared from the laminates of the invention can be fastened to cylinders of very small diameter without there being any risk of portions of the relief image, particularly those very near the edges, becoming detached from the base.

The invention is further illustrated by the following Examples in which parts and percentages are by weight. The K values were determined according to H. Fikentscher, Cellulosechemie, 13, 60 (1932).

EXAMPLE 1

A sheet of aluminum 0.9 mm in thickness was degreased with an alkali, washed with distilled water and then treated for 1 minute in a chromating bath.

To prepare the intermediate layer (b) 100 parts of an alcoholsoluble copolyamide A and 10 parts of a curable phenolic resin B were dissolved in 500 parts of methanol and 50 parts of water at 60°C. Copolyamide A was produced by polycondensation of approximately equal parts of hexamethylenediammonium adipate, 4,-4'-diammoniumdicyclohexylmethane adipate and ε-caprolactam and had a K value of 67. Curable phenolic resin B was prepared by condensation of 30 parts of phenol, 30 parts of formalin (37%), 11 parts of paraformaldehyde and 7.5 parts of 2,2-bis(p-hydroxyphenyl)-propane in 50 parts of ethyl glycol and 5 parts of N,N-dimethylethanolamine at 100°C until a viscosity of 35 sec in a Ford D 4 beaker at 25°C was achieved.

The solution of the mixture of polyamide and curable phenolic resin was poured onto the sheet of aluminum in such an amount that a layer approx. 100 μ in thickness was obtained. The coated sheet was allowed to stand in the air for 20 minutes and then baked for 20 minutes at about 150°C. A 20 μ thick coating was obtained which was not soluble in alcohol.

100 parts of the said copolyamide A, 65 parts p-xylylene-bisacrylamide, 15 parts of triethylene glycol diacrylate, 1 part of benzoin methyl ether and 0.1 part of p-methoxyphenol were dissolved in 400 parts of methanol and 10 parts of water. The resulting clear visous solution was poured into dishes and ventilated well for 24 hours in the absence of daylight. The dry product obtained was broken up into chips which were subjected to further drying in a drying cabinet at 35°C. The dried chips were then molded under a pressure of 25 kg/cm$^2$ in a hydraulic press heated to 170° to 175°C into a 0.85 mm thick film which was clear and transparent after cooling. The photopolymer film obtained was applied, with the aid of a squeegee roll, to the aluminum sheet coated with intermediate layer (b), the intermediate layer being moistened with a mixture of propanol and water. The photopolymer film and aluminum sheet were than passed slowly between a pair of rubber rolls, excess propanol/water mixture being squeezed out at the sides.

After 48 hours part of the laminate was examined to ascertain the strength of the bond between the photopolymer layer (c) and the metal base. Another part of the laminate was exposed for 10 minutes through a combination line and halftone negative in a commercially available exposure unit for photopolymer plates. The exposed plate was washed out with a mixture of 90 parts of ethanol and 10 parts of water for 12 minutes at 30°C. All non-exposed areas of the photosensitive layer (c) were removed down to the intermediate layer (b). Adhesion between the resulting relief image and the metal base was then determined. It was found that the unexposed laminate and the exposed and washed-out element exhibited very good adhesion between the photosensitive layer (c) and metal base and the relief image and metal base respectively. The intermediate layer (b) of the invention was not affected by the wash-out process.

EXAMPLE 2

A degreased steel sheet 0.24 mm in thickness and tin-coated on one side was provided on the untinned side with an intermediate layer (b) according to the invention. The intermediate layer (b) was prepared from a mixture of 100 parts of a copolyamide (derived from 468 parts of p,p'-diaminodicyclohexylmethane, 731 parts of heptadecanedicarboxylic acid and 300 parts of capryllactam (K value 43)) and 30 parts of a curable phenolic resin (prepared by condensation of 2,2-bis(p-hydroxyphenyl)-propane with a molar excess of formaldehyde in the presence of N,N-dimethylethanolamine), and baked for about 30 minutes at 180°C. The thickness of intermediate layer (b) was approx. 12 μ. A photopolymer film (layer (c)) as described in Example 1 was then laminated to the steel sheet provided with intermediate layer (b). An element was obtained which could not be delaminated without tearing the polyamide film, i.e. adhesion was at least of the same order of magnitude as cohesion in the polyamide film.

COMPARATIVE EXPERIMENT

A steel sheet was provided with a photosensitive layer (c) having the composition given in Example 1; a solution of the components in a methanol/water mixture was poured onto the steel sheet and the applied coating was then dried. The coating had a thickness of approx. 20 μ and was substantially crosslinked by exposure to a mercury vapor lamp.

A photopolymer film having the composition given in Example 1 was then laminated to the coated steel sheet in exactly the same manner and under the same conditions as described in Example 1. An element was obtained, the photopolymer layer (c) and metal base of which could be easily detached from the intermediate polyamide layer crosslinked by exposure.

EXAMPLES 3 and 4

The procedure of Example 2 was followed except that for one batch 5 parts of hexamethoxymethylmelamine was added to the mixture of 100 parts of polyamide and 30 parts of phenolic resin, and for another 10 parts of a commercially available curable epoxy resin prepared from 2,2-bis(p-hydroxyphenyl)-propane and epichlorohydrin having a molecular weight of about 550 was added to the said mixture. Intermediate layers were prepared with these batches as described in Example 2 and cured at approx. 220°C.

Photopolymer films (layer (c)) were laminated to the coated bases as described in Example 2. The resulting elements were exposed imagewise and the unexposed areas of layers (c) were washed out to give relief printing plates which exhibited outstanding adhesion between the photopolymer layer and metal base.

We claim:

1. A laminate suitable for the production of printing plates and consisting essentially of a. a metal base, b. a thin intermediate layer of a crosslinked polymer, c. a thin layer which is solid at room temperature and consists essentially of a photopolymerizable intimate mixture of c1. 50 to 90 % by weight of a synthetic polyamide which is solid at room temperature and soluble in an organic solvent and contains recurring amide groups in the main chain of the molecule, c2. 10 to 50 % by weight of at least one monomeric compound containing at least two photopolymerizable ethylenically unsaturated double bonds or of a mixture of at least one such compound with not more than about 30 % by weight, based on the total amount of monomers, of at least one monomeric compound having only one photopolymerizable ethylenically unsaturated double bond, the monomers not boiling at a temperature below 100°C at atmospheric pressure, and c3. an effective amount of a photo-initiator, and d. an optional thin light-transmitting protective cover sheet, wherein said intermediate layer (b) is a layer which has been cured by heating to a temperature of from 80° to 300°C and is based on an intimate mixture of (b) 50 to 98% by weight of a synthetic polyamide which is solid at room temperature, contains recurring amide groups in the main chain of the molecule and is substantially compatible with the polyamide of layer (c), and (b2) 2 to 50% by weight of a curable phenolic resin having a molecular weight of less than 10,000 or a mixture of such a phenolic resin with an amount of a curable amino or epoxy resin having a molecular weight of less than 1,000 which is smaller than the amount of phenolic resin.

2. A laminate as claimed in claim 1, wherein layer (c) contains 0.01 to 10% by weight of a photoinitiator.

3. A laminate as claimed in claim 1, wherein layer (c) contains 0.01 to 3% by weight of a thermal polymerization inhibitor.

4. A laminate as set forth in claim 1, wherein said metal base has been mechanically or chemically pretreated and primed.

5. A process for the production of laminates which are suitable for the production of printing plates, wherein there is applied to a metal base (a) a thin intermediate layer (b) based on an intimate mixture of b1. 50 to 98% by weight of a synthetic polyamide which is solid at room temperature, contains recurring amide groups in the main chain of the molecule and is substantially compatible with the polyamide of layer (c), and b2. 2 to 50% by weight of a curable phenolic resin having a molecular weight of less than 10,000 or a mixture of such a phenolic resin with an amount of a curable amino or epoxy resin having a molecular weight of less than 1,000 which is smaller that the amount of phenolic resin, the applied intermediate layer (b) is cured at a temperature of from 80° to 300°C, a thin layer (c) is applied in a conventional manner, which is solid at room temperature and consists essentially of a photopolymerizable intimate mixture of c1. 50 to 90% by weight of a synthetic polyamide which is solid at room temperature and soluble in an organic solvent and contains recurring amide groups in the main chain of the molecule, and c2. 10 to 50% by weight of at least one monomeric compound containing at least two photopolymerizable ethylenically unsaturated double bonds or of a mixture of at least one such compound with less than 30% by weight, based on the total amount of monomers, of at least one monomeric compound having only one photopolymerizable ethylenically unsaturated double bond, the monomers not boiling at a temperature below 100°C at atmospheric pressure, and c3. an effective amount of a photo-initiator.

6. A process as claimed in claim 5, wherein a phenolic resin is used which contains reactive methylol groups and/or methylol groups etherified with an aliphatic alcohol of 1 to 8 carbon atoms.

7. A process as claimed in claim 5, wherein a soluble curable phenolic resin, amino resin and/or epoxy resin is used.

8. A process as claimed in claim 5, wherein a polyamide which is soluble in an organic solvent is used as polyamide for layer (c).

9. A process as claimed in claim 5, wherein layer (b) is cured at a temperature of from 120° to 220°C.

10. A process as claimed in claim 5, wherein 5 to 20% by weight, based on the total amount of polyamide and phenolic resin, of a soluble curable phenolic resin is used for layer (b).

11. A process as claimed in claim 4 wherein a thin light-transmitting protective cover sheet (d) is applied to said thin layer (c).

* * * * *

UNITED STATES PATENT AND TRADEMARK OFFICE

CERTIFICATE OF CORRECTION

PATENT NO. : 3,861,921

DATED : January 21, 1975

INVENTOR(S) : Horst Hoffmann et al.

It is certified that error appears in the above-identified patent and that said Letters Patent are hereby corrected as shown below:

In the Heading, insert -- Assignee: Badische Anilin- & Soda-Fabrik Aktiengesellschaft, Ludwigshafen (Rhine), Germany --

In Column 3, Line 66, delete "uch as" and insert --such as--

Signed and Sealed this

Twenty-third Day of November 1976

[SEAL]

*Attest:*

RUTH C. MASON
*Attesting Officer*

C. MARSHALL DANN
*Commissioner of Patents and Trademarks*